United States Patent
Lian et al.

(10) Patent No.: US 12,237,184 B1
(45) Date of Patent: Feb. 25, 2025

(54) HEATING STRUCTURE AND WAFER TEST DEVICE

(71) Applicant: SEMIGHT INSTRUMENTS CO., LTD, Suzhou (CN)

(72) Inventors: Zhe Lian, Suzhou (CN); Bin Zhou, Suzhou (CN); Xiaoming Guo, Suzhou (CN); Pengsong Xu, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 0 days.

(21) Appl. No.: 18/427,094

(22) Filed: Jan. 30, 2024

Related U.S. Application Data

(63) Continuation of application No. PCT/CN2023/134135, filed on Nov. 24, 2023.

(30) Foreign Application Priority Data

Nov. 13, 2023 (CN) .......................... 202323056450.6

(51) Int. Cl.
  *G01R 31/28* (2006.01)
  *H01L 21/67* (2006.01)
  *H01L 21/687* (2006.01)

(52) U.S. Cl.
  CPC .... *H01L 21/67103* (2013.01); *G01R 31/2875* (2013.01); *H01L 21/68771* (2013.01)

(58) Field of Classification Search
  CPC ............ G01R 31/2856; G01R 31/2875; G01R 31/2877
  See application file for complete search history.

(56) References Cited

U.S. PATENT DOCUMENTS

| | | | |
|---|---|---|---|
| 2006/0145718 A1* | 7/2006 | Lopez | G01K 1/16 324/750.07 |
| 2015/0084657 A1 | 3/2015 | Clairet et al. | |
| 2020/0013645 A1* | 1/2020 | Gouda | G01R 31/2879 |

FOREIGN PATENT DOCUMENTS

| | | |
|---|---|---|
| CN | 202962505 U | 6/2013 |
| CN | 211653063 U | 10/2020 |
| CN | 217903076 A | 11/2022 |
| CN | 116356290 A | 6/2023 |
| JP | H059740 A | 1/1993 |
| JP | 2005347612 A | 12/2005 |
| TW | 200541378 A | 12/2005 |
| WO | 2023116161 A1 | 6/2023 |

* cited by examiner

*Primary Examiner* — Tung X Nguyen
(74) *Attorney, Agent, or Firm* — ANOVA LAW GROUP, PLLC

(57) ABSTRACT

A heating structure and a wafer test device are provided. The heating structure includes: a heating base, provided with a heating element inside the heating base; a mounting component, disposed above the heat base and including a plurality of mounting stations arranged at intervals; and a plurality of insulating thermo-conductive blocks. Each of the plurality of insulating thermo-conductive blocks is disposed at one corresponding mounting station of the plurality of mounting stations and protrudes from the mounting component for contacting a clamp of the wafer test device.

10 Claims, 3 Drawing Sheets

HEATING STRUCTURE AND WAFER TEST DEVICE

CROSS-REFERENCE TO RELATED APPLICATION

This application is a continuation of International Application No. PCT/CN2023/134135, filed on Nov. 24, 2023, which claims priority to Chinese Patent Application No. 202323056450.6, filed on Nov. 13, 2023, the content of all which is incorporated herein by reference in its entirety.

TECHNICAL FIELD

The present disclosure generally relates to the field of wafer test technology and, more particularly, relates to a heating structure and a wafer test device.

BACKGROUND

Wafers are made of silicon elements through a special processing process. The produced wafers need to undergo wafer testing, and unqualified wafers will be discarded. Generally, after forming a wafer, an aging test will be performed on the wafer. The wafer aging test includes a high-temperature test, during which the wafer is placed in a high-temperature environment for testing.

In the wafer test in existing technologies, the wafer is placed in a sealed cavity defined by a heat sink of a fixture. A heating component is placed at a bottom of the fixture. The heating component is used to heat the heat sink, such that the heat is able to be transferred to the wafer to heat the wafer. During the actual test, it was found that direct contact between the heat sink of the fixture and the heating component causes conduction between high voltage applied at the bottom of the wafer and a metal body of the heating component, and then causes leakage. This not only affects the results of the wafer test, but also poses a safety hazard.

SUMMARY

Various embodiments of the present disclosure provide a heating structure and a wafer test device, to at least partially alleviate the problem of high voltage power generation because of the direct contact between the clamp and the heating component, and also heat the wafer evenly.

One aspect of the present disclosure provides a heating structure for a wafer test device. The heating structure includes: a heating base, provided with a heating element inside the heating base; a mounting component, disposed above the heat base and including a plurality of mounting stations arranged at intervals; and a plurality of insulating thermo-conductive blocks. Each of the plurality of insulating thermo-conductive blocks is disposed at one corresponding mounting station of the plurality of mounting stations and protrudes from the mounting component for contacting a clamp of the wafer test device.

Optionally, the plurality of mounting stations of the mounting component are evenly arranged, such that the plurality of the insulating thermo-conductive blocks are evenly arranged on the mounting component.

Optionally, protrusion amount of the plurality of insulating thermo-conductive blocks relative to the mounting component is about 5.0 mm to about 10.0 mm.

Optionally, the mounting component, the plurality of mounting stations and the plurality of insulating thermo-conductive blocks are all circular in shape; and one of the plurality of insulating thermo-conductive blocks is located at a center of the mounting component, and other insulating thermo-conductive blocks are evenly arranged along a circumferential direction of the insulating thermally conductive block at the center of the mounting component.

Optionally, the plurality of mounting stations and the plurality of insulating thermo-conductive blocks are fan-shaped.

Optionally, the plurality of insulating thermo-conductive blocks is evenly arranged at the center of the mounting component.

Optionally, the heating structure further includes a plurality of graphite pads. Each graphite pad of the plurality of graphite pads is arranged corresponding to one of the plurality of insulating thermo-conductive blocks, and is disposed below the corresponding insulating thermo-conductive block.

Optionally, a thickness of the plurality of graphite pads is about 0.8 mm to about 1.5 mm.

Optionally, the plurality of mounting stations is hole-shaped; a portion of each of the plurality of insulating thermo-conductive blocks is disposed inside one corresponding mounting station of the plurality of mounting stations; and each of the plurality of graphite pads is located inside one corresponding mounting station.

Optionally, each of the plurality of graphite pads has a lower surface contact with the heating base and an upper surface in contact with a corresponding one of the plurality of insulating thermo-conductive blocks.

Optionally, a protruding clamping component is provided at a lower edge of an outer wall of each of the plurality of insulating thermo-conductive blocks; and a protruding limiting component is provided on an upper edge of a side wall of each of the plurality of mounting stations; and clamping components and limiting components cooperate to limit positions of the plurality of insulating thermo-conductive blocks.

Optionally, the plurality of insulating thermo-conductive blocks includes ceramic pads.

Another aspect of the present disclosure provides a wafer test device. The wafer test device includes a clamp and a heating structure under the clamp. The heating structure includes: a heating base, provided with a heating element inside the heating base; a mounting component, disposed above the heat base and including a plurality of mounting stations arranged at intervals; and a plurality of insulating thermo-conductive blocks. Each of the plurality of insulating thermo-conductive blocks is disposed at one corresponding mounting station of the plurality of mounting stations and protrudes from the mounting component for contacting a clamp of the wafer test device.

Optionally, the plurality of mounting stations of the mounting component are evenly arranged, such that the plurality of the insulating thermo-conductive blocks are evenly arranged on the mounting component.

Optionally, the mounting component, the plurality of mounting stations and the plurality of insulating thermo-conductive blocks are all circular in shape; and one of the plurality of insulating thermo-conductive blocks is located at a center of the mounting component, and other insulating thermo-conductive blocks are evenly arranged along a circumferential direction of the insulating thermally conductive block at the center of the mounting component.

Optionally, the plurality of mounting stations and the plurality of insulating thermo-conductive blocks are fan-shaped.

Optionally, the plurality of insulating thermo-conductive blocks is evenly arranged at the center of the mounting component.

Optionally, the heating structure further includes a plurality of graphite pads. Each graphite pad of the plurality of graphite pads is arranged corresponding to one of the plurality of insulating thermo-conductive blocks, and is disposed below the corresponding insulating thermo-conductive block.

Optionally, the plurality of mounting stations is hole-shaped; a portion of each of the plurality of insulating thermo-conductive blocks is disposed inside one corresponding mounting station of the plurality of mounting stations; and each of the plurality of graphite pads is located inside one corresponding mounting station.

Optionally, each of the plurality of graphite pads has a lower surface contact with the heating base and an upper surface in contact with a corresponding one of the plurality of insulating thermo-conductive blocks.

In the present disclosure, the plurality of mounting stations may be set on the mounting component, and the plurality of insulating thermo-conductive blocks may be installed on the plurality of mounting stations. Each of the plurality of insulating thermo-conductive blocks 30 may protrude relative to the mounting component, such that the plurality of insulating thermo-conductive blocks contacts the clamp to avoid generation of high voltage power because of direct contact between the mounting component and the clamp. Further, in the present embodiment, the plurality of insulating thermo-conductive blocks may be adopted instead of a whole piece of one insulating thermo-conductive block, preventing the plurality of insulating thermo-conductive blocks from being broken.

Also, the plurality of mounting stations and the plurality of insulating thermo-conductive blocks may be circular in shape. One of the plurality of insulating thermo-conductive blocks may be disposed at the center and others of the plurality of insulating thermo-conductive blocks may be arranged along the circumference of the one at the center. This arrangement may help the heat of the plurality of insulating thermo-conductive blocks 30 to be evenly transferred to various parts of the clamp such that the clamp is evenly heated, and also may improve the heat transfer efficiency of the plurality of insulating thermo-conductive blocks, to achieve high-temperature aging testing of wafers at 175-200° C.

BRIEF DESCRIPTION OF THE DRAWINGS

The following drawings are merely examples for illustrative purposes according to various disclosed embodiments and are not intended to limit the scope of the present disclosure. The same reference numbers in the drawings identify the same or similar parts or portions. Those skilled in the art should understand that these drawings are not necessarily drawn to scale.

DETAILED DESCRIPTION

Reference will now be made in detail to exemplary embodiments of the disclosure, which are illustrated in the accompanying drawings. Obviously, the described embodiments are just some of the embodiments of the present disclosure, but not all of the embodiments. Based on the embodiments in this disclosure, all other embodiments obtained by those of ordinary skill in the art without creative work shall fall within the scope of this disclosure.

Figure 1:
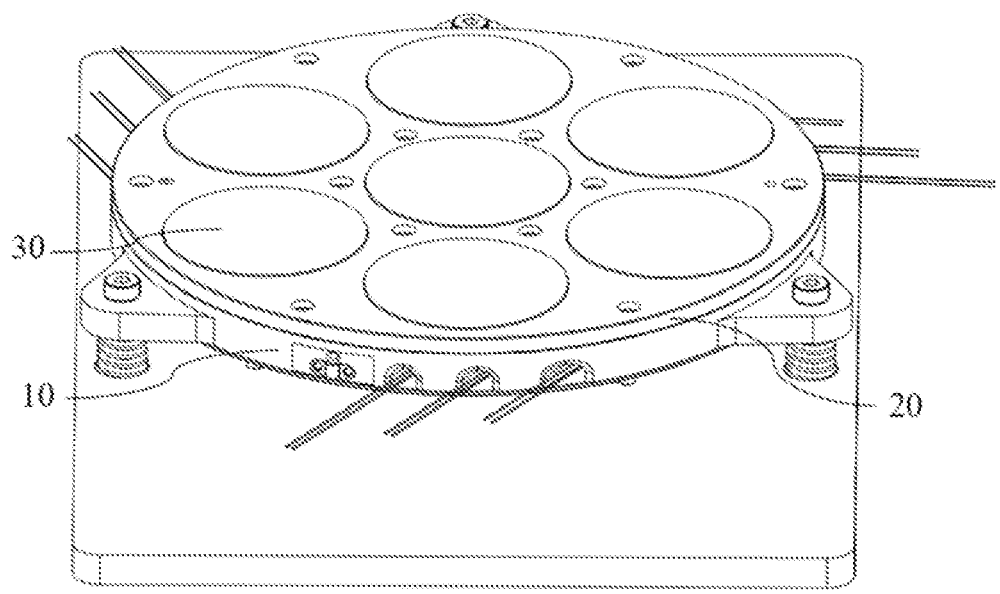
FIG. 1 illustrates an exemplary heating structure of a wafer test device according to various disclosed embodiments of the present disclosure.

The present disclosure provides a heating structure of a wafer test device. As shown in FIG. 1, in one embodiment, the wafer test device may include the heating structure 100 and a clamp. The heating structure 100 may be located below the clamp. The heating structure 100 may include a heating base 10, a mounting component 20 and a plurality of insulating thermo-conductive blocks 30. A heating element may be provided inside the heating base 10. The mounting component 20 may be located above the heating base 10, and may be provided with a plurality of mounting stations 21 arranged at intervals. Each insulating thermo-conductive block 30 of the plurality of insulating thermo-conductive blocks 30 may be disposed at one corresponding mounting station 21 and protrude from the mounting component 20 to contact the clamp. In one embodiment, the wafer may be located on a base of the clamp, and the heating base 10 may be located below the clamp to heat the wafer in the clamp. The plurality of insulating thermo-conductive blocks 30 may be installed on the plurality of mounting stations 21 on the mounting component 20. The plurality of insulating thermo-conductive blocks 30 may be arranged at intervals, and may protrude upward relative to the mounting component 20 to contact the clamp. The protrusion amount of the plurality of insulating thermo-conductive blocks 30 relative to the mounting component 20 may be set to any value between 5.0 mm and 10.0 mm according to actual needs. In one embodiment, the protrusion amount of the plurality of insulating thermo-conductive blocks 30 relative to the mounting component 20 may be set to 8.0 mm.

In this embodiment, the plurality of mounting stations may be set on the mounting component 20, and the plurality of insulating thermo-conductive blocks 30 may be installed on the plurality of mounting stations 21. Each of the plurality of insulating thermo-conductive blocks 30 may protrude relative to the mounting component 20, such that the plurality of insulating thermo-conductive blocks 30 contacts with the clamp to avoid generation of high voltage power because of direct contact between the mounting component 20 and the clamp. Further, when a single piece of insulating thermo-conductive block 30 with the same or similar size as the mounting component 20 is placed directly above the mounting component 20 as a whole, the insulating thermo-conductive block 30 is prone to uneven heating and may cause fragmentation. Therefore, in the present embodiment, the plurality of insulating thermo-conductive blocks 30 may be adopted to prevent the plurality of insulating thermo-conductive blocks 30 from being broken.

In one embodiment, the plurality of mounting stations 21 of the mounting component 20 may be evenly arranged, such that the plurality of insulating thermo-conductive blocks 30 are evenly arranged on the mounting component 20. The clamp may be in direct contact with the plurality of insulating thermo-conductive blocks 30 protruding from the mounting component 20, and the heat generated by the heating base 10 may be transferred to the clamp through the plurality of insulating thermo-conductive blocks 30. By disposing the plurality of insulating thermo-conductive blocks 30 on the plurality of mounting stations 21 of the mounting component 20, the clamp may be evenly heated to avoid temperature deviation of the clamp.

Figure 2:
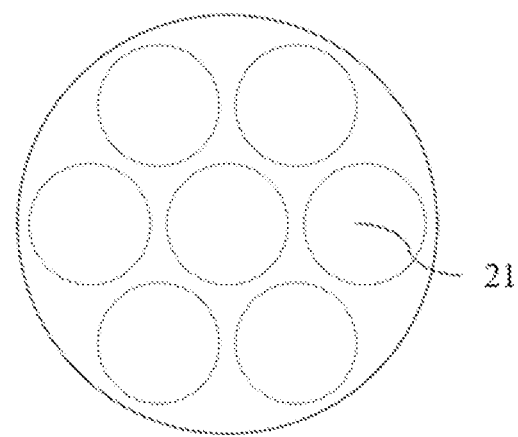
FIG. 2 illustrates a mounting component of a heating structure according to various disclosed embodiments of the present disclosure.

In one embodiment, as shown in FIG. 2 illustrating an exemplary mounting component of the heating structure, the mounting component 20, the plurality of mounting stations 21 and the plurality of insulating thermo-conductive blocks 30 may be all circular in shape. One insulating thermo-conductive block 30 of the plurality of insulating thermo-conductive blocks 30 may be located at a center of the mounting component 20, and other insulating thermo-conductive blocks 30 may be evenly arranged in the circumferential direction of the insulating thermo-conductive block 30 at the center of the mounting component 20. In the present embodiment, the plurality of insulating thermo-conductive blocks 30 with circular shapes may be installed on the plurality of mounting station 21 with circular shapes of the circular mounting component 20. One insulating thermo-conductive block 30 of the plurality of insulating thermo-conductive blocks 30 may be located at a center of the mounting component 20, and other insulating thermo-conductive blocks 30 may be evenly arranged in the circumferential direction of the insulating thermo-conductive block 30 at the center of the mounting component 20. That is, the plurality of insulating thermo-conductive blocks 30 may be evenly distributed in a petal shape on the mounting component 20, and distances from the plurality of insulating thermo-conductive blocks 30 arranged along the circumference to the center position of the heating structure 100 may be equal. This arrangement may help the heat of the plurality of insulating thermo-conductive blocks 30 to be evenly transferred to various parts of the clamp such that the clamp is evenly heated, and also may improve the heat transfer efficiency of the plurality of insulating thermo-conductive blocks 30.

Figure 3:
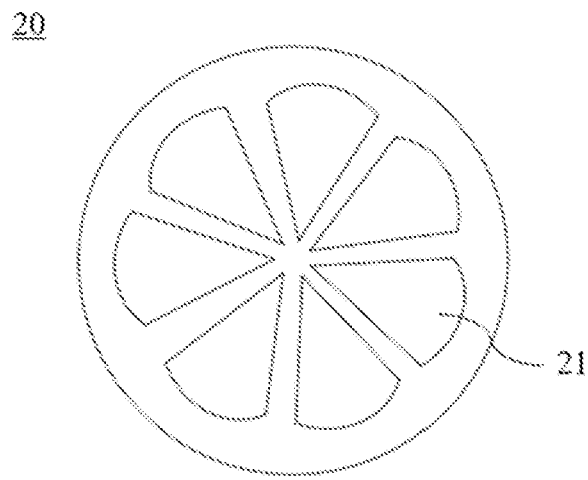
FIG. 3 illustrates another mounting component of a heating structure according to various disclosed embodiments of the present disclosure.

In another embodiment, as shown in FIG. 3 illustrating another exemplary mounting component of the heating structure, the plurality of mounting station 21 and the plurality of insulating thermo-conductive blocks 30 may be fan-shaped. The plurality of insulating thermo-conductive blocks 30 in a fan shape may be evenly arranged along the center of the mounting member 20, and the distances between each of the plurality of insulating thermo-conductive blocks 30 and the center position of the heating structure 100 may be equal. This arrangement may improve the heat transfer efficiency of the plurality of insulating thermo-conductive blocks 30, and may also help the heat of the plurality of insulating thermo-conductive blocks 30 to be evenly transferred to various parts of the clamp such that the clamp is evenly heated, to achieve high-temperature aging testing of wafers at 175-200° C.

Figure 4:
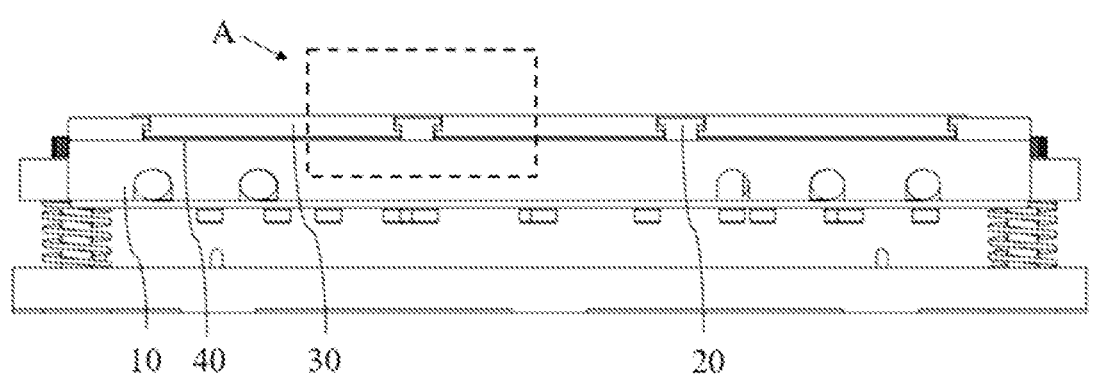
FIG. 4 illustrates a cross-sectional view of a heating structure according to various disclosed embodiments of the present disclosure.
Figure 5:
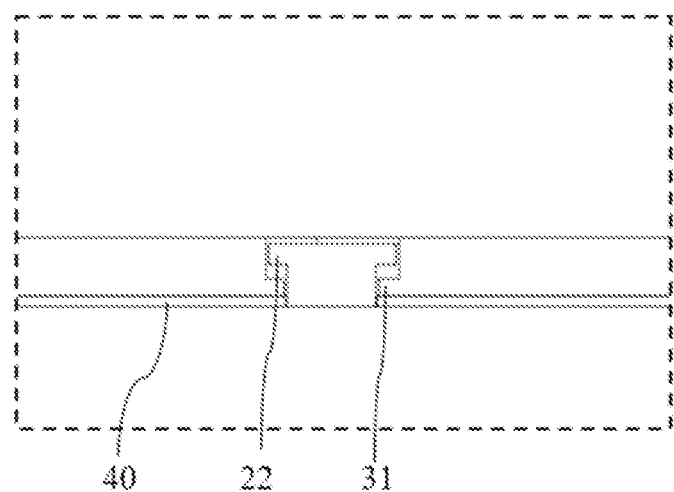
FIG. 5 illustrates a partially enlarged view of point A in FIG. 4, according to various disclosed embodiments of the present disclosure.

FIG. 4 illustrates a cross-sectional view of the hating structure and FIG. 5 illustrates a partially enlarged view of point A in FIG. 4, the wafer test device may further include a plurality of graphite pads 40. Each of the plurality of graphite pads 40 may be arranged corresponding to one of the plurality of insulating thermo-conductive blocks 30. Each of the plurality of graphite pads 40 may be located below the corresponding insulating thermo-conductive block 30 of the plurality of insulating thermo-conductive blocks 30. The plurality of graphite pads 40 may have a certain thickness, and may be able to be compressed to a certain amount and fill gaps of the contact surfaces between the plurality of insulating thermo-conductive blocks and the heating base 10. The plurality of graphite pads 40 may be a good conductor of heat, and may be conducive to improving the heat transfer efficiency between the heating base 10 and the plurality of insulating heat conducting blocks 30. Further, the small amount of compression of the plurality of graphite pads 40 may also make the upper surfaces of the plurality of insulating heat conducting blocks 30 flush and avoid low heat transfer efficiency because of uneven surfaces of the plurality of insulating thermo-conductive blocks 30.

In this embodiment, the thickness of the plurality of graphite pads 40 may be any value in the range of 0.8 mm-1.5 mm. The plurality of graphite pads 40 may be installed on the lower surfaces of the plurality of insulating thermo-conductive blocks, which is simple and convenient. The thickness of 0.8-1.5 mm may be moderate, which may meet the heat transfer requirements and may have little impact on the accommodation space at the plurality of mounting stations 21. In one embodiment, the thickness of the plurality of graphite pads 40 may be set to 1.0 mm. In other embodiments, the thickness of the plurality of graphite pads 40 may be set according to actual needs.

In one embodiment, the plurality of mounting stations 21 may be hole-shaped, and a portion of each of the plurality of insulating thermo-conductive blocks 30 may be disposed inside one corresponding mounting station 21 of the plurality of mounting stations 21. Each of the plurality of graphite pads 40 may be located inside one corresponding mounting station 21 and the lower surface may be in contact with the heating base 10. It can be understood that the plurality of mounting stations 21 may be openings located on the surface of the mounting component 20, and the plurality of insulating thermo-conductive blocks 30 may protrude from the mounting component 20. A portion of each of the plurality of insulating thermo-conductive blocks 30 may be disposed inside one corresponding mounting station 21 of the plurality of mounting stations 21, and another portion may be located outside the corresponding mounting station 21 and may be in contact with the clamp. Each of the plurality of graphite pads 40 may be located inside one corresponding mounting station 21 and between the heating base 10 and one corresponding insulating thermo-conductive block 30. The upper surface of each graphite pad 40 may be in contact with the corresponding insulating thermo-conductive block 30 and the lower surface may be in contact with the heating base 10, to improve the heat transfer efficiency between the heating base 10 and the plurality of insulating thermo-conductive blocks 30.

In one embodiment, a lower edge of an outer wall in one insulating thermo-conductive block 30 of the plurality of insulating thermo-conductive blocks 30 may be provided with a protruding clamping component 31, and an upper edge of a side wall of one corresponding mounting station 21 may be provided with a protruding limiting component 22. The limiting component 22 may cooperate with the clamping component 31 to limit the position of the insulating thermo-conductive block 30. In one embodiment, the protruding limiting component 22 at the upper edge of the side wall of the mounting station 21 may cooperate with the protruding clamping component 31 at the lower edge of the outer wall of the insulating thermo-conductive block 30 to limit the vertical position of the insulating thermo-conductive block 30. Therefore, the insulating thermo-conductive block 30 may be fixed on the mounting component 20 to prevent the insulating thermo-conductive block 30 from being displaced. There may be a certain gap between the limiting component 22 and the clamping component 31 to reserve a certain space for accommodating one corresponding graphite pad 40.

In one embodiment, the plurality of insulating thermo-conductive blocks 30 may be ceramic pads. The ceramic pads may have fast heating speed and heat transfer speed, and the plurality of graphite pads 40 may have fast heat conduction and good heat conduction effect. By adding the plurality of graphite pads 40 at the bottom of the ceramic pads, the ceramic pads and the plurality of graphite pads 40 may cooperate to make the wafer in the clamp be more evenly heated, and may also effectively conduct heat to prevent the heat energy from moving away from the clamp, improving the overall heat utilization rate of the heating base 10.

The present disclosure also provides a wafer test device. The wafer test device may include any heating structure 100 provided by various embodiments of the present disclosure.

In the present disclosure, the plurality of mounting stations may be set on the mounting component 20, and the plurality of insulating thermo-conductive blocks 30 may be installed on the plurality of mounting stations 21. Each of the plurality of insulating thermo-conductive blocks 30 may protrude relative to the mounting component 20, such that the plurality of insulating thermo-conductive blocks 30 contacts with the clamp to avoid generation of high voltage power because of direct contact between the mounting component 20 and the clamp. Further, the plurality of insulating thermo-conductive blocks 30 may be adopted instead of a single piece of an insulating thermo-conductive block, to prevent the plurality of insulating thermo-conductive blocks 30 from being broken.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A heating structure, comprising:
a heating base, wherein a heating element is disposed in the heating base;
a mounting component, disposed above the heat base and including a plurality of mounting stations arranged at intervals; and
a plurality of insulating thermo-conductive blocks, wherein each of the plurality of insulating thermo-conductive blocks is disposed at one corresponding mounting station of the plurality of mounting stations and protrudes from the mounting component for contacting a clamp of a wafer test device.

2. The heating structure according to claim 1, wherein:
the plurality of mounting stations of the mounting component are evenly arranged, such that the plurality of the insulating thermo-conductive blocks are evenly arranged on the mounting component.

3. The heating structure according to claim 2, wherein:
the mounting component, the plurality of mounting stations and the plurality of insulating thermo-conductive blocks are all circular in shape; and
one of the plurality of insulating thermo-conductive blocks is located at a center of the mounting component, and other insulating thermo-conductive blocks are evenly arranged along a circumferential direction of the insulating thermally conductive block at the center of the mounting component.

4. The heating structure according to claim 2, wherein:
the plurality of mounting stations and the plurality of insulating thermo-conductive blocks are fan-shaped.

5. The heating structure according to claim 1, further including a plurality of graphite pads, wherein:
each graphite pad of the plurality of graphite pads is arranged corresponding to one of the plurality of insulating thermo-conductive blocks, and the graphite pad is disposed below the corresponding insulating thermo-conductive block.

6. The heating structure according to claim 5, wherein:
a thickness of the plurality of graphite pads is about 0.8 mm to about 1.5 mm.

7. The heating structure according to claim 6, wherein:
the plurality of mounting stations is hole-shaped;
a portion of each of the plurality of insulating thermo-conductive blocks is disposed inside one corresponding mounting station of the plurality of mounting stations; and
each of the plurality of graphite pads is located inside one corresponding mounting station.

8. The heating structure according to claim 7, wherein:
a protruding clamping component is provided at a lower edge of an outer wall of each of the plurality of insulating thermo-conductive blocks; and a protruding limiting component is provided on an upper edge of a side wall of each of the plurality of mounting stations; and
clamping components and limiting components cooperate to limit positions of the plurality of insulating thermo-conductive blocks.

9. The heating structure according to claim 1, wherein:
the plurality of insulating thermo-conductive blocks includes ceramic pads.

10. A wafer test device, comprising a clamp and a heating structure under the clamp, wherein:
the heating structure includes:
a heating base, wherein a heating element is disposed in the heating base;
a mounting component, disposed above the heat base and including a plurality of mounting stations arranged at intervals; and
a plurality of insulating thermo-conductive blocks, wherein each of the plurality of insulating thermo-conductive blocks is disposed at one corresponding mounting station of the plurality of mounting stations and protrudes from the mounting component for contacting the clamp.

* * * * *